United States Patent [19]

Jung

[11] Patent Number: 5,963,484
[45] Date of Patent: *Oct. 5, 1999

[54] HIGH SPEED SINGLE-ENDED AMPLIFIER OF A LATCHED TYPE

[75] Inventor: Chang Ho Jung, Kyoungki-do, Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/885,016

[22] Filed: Jun. 30, 1997

[30] Foreign Application Priority Data

Jun. 29, 1996 [KR] Rep. of Korea .................. 96-26522

[51] Int. Cl.$^6$ ...................................... G11C 7/00
[52] U.S. Cl. ................. 365/189.09; 365/202; 365/203; 365/207; 365/210
[58] Field of Search .................... 365/189.09, 207, 365/210, 208, 202, 203

[56] References Cited

U.S. PATENT DOCUMENTS 4,669,063  5/1987  Kirsch ................................. 365/189
5,608,668  3/1997  Zagar et al. ................... 365/189.09 X

*Primary Examiner*—Do Hyun Yoo
*Attorney, Agent, or Firm*—Jacobson, Price, Holman & Stern, PLLC

[57] ABSTRACT

Disclosed is a single-ended bit line structure of latched type, capable of sensing data at a high speed. The present invention decreasing the power consumption, by selectively separating the single-ended sense amplifier from the bit line and the reference voltage generator through the PMOS transistors at the same time the sensing operation starts. The single-ended bit line structure according to the present invention includes a reference voltage generator for generating a constant voltage, a latched-type sense amplifier and a switching unit for separating the latched-type sense amplifier from the reference voltage generator and a bit line at the same time the latched-type sense amplifier is enabled.

6 Claims, 4 Drawing Sheets

HIGH SPEED SINGLE-ENDED AMPLIFIER OF A LATCHED TYPE

BACKGROUND OF THE INVENTION

1. Field of the Invention

The present invention relates to a memory device, and more particularly to a single-ended bit line structure of latched type, capable of sensing data at a high speed.

2. Description of Prior Art

In general, the single-ended bit line structure is adapted to a multi-port SRAM, a ROM, a PLA and the like. The single-ended bit line structure amplifies and senses the voltage difference between a referenced bit line and a bit line coupled to the cell in which data is stored. This single-ended bit line structure has been used for a low speed and has employed a simplified differential amplifier.

However, the chip for a high speed and a low power consumption is needed. In particular, with the increase of the speed of the microprocessor, it has been very important to design the architecture of the memory device operating at low power consumption.

FIG. 1 is a block diagram illustrating a ROM having a conventional single-ended sense amplifier.

Referring to FIG. 1, the conventional single-ended sense amplifier includes a differential sense amplifier 10 which senses the voltage difference between a reference voltage from a reference voltage generator 20 and the bit lie voltage and then amplifies it. The reference voltage generator 20 provides a low voltage, for example, the threshold voltage caused by the diode connection of a PMOS and NMOS transistors, to the differential sense amplifier 10 such that the differential sense amplifier 10 senses data stored in the memory cell.

On the other hand, to decrease the power consumption of the differential sense amplifier, the sense enable clock signal to enable the differential sense amplifier must be generated after the voltage on the bit line is enough higher or lower than the reference voltage. Accordingly, it is impossible for the conventional single-ended sense amplifier to operate at a high speed and in a low voltage.

SUMMARY OF THE INVENTION

Therefore, an object of the present invention is to provide a single-ended sense amplifier capable of operating at a high speed and in a low voltage.

In accordance with an aspect of the present invention, there is provided a semiconductor device having single-ended bit line structure, said semiconductor device comprising: a reference voltage generating means for generating a constant voltage through a capacitor charge sharing means; a latched-type sense amplifying means for amplifying a voltage difference between an output from said reference voltage generating means and an output from a bit line coupled to a memory cell; and a switching means for separating said latched-type sense amplifying means from said reference voltage generating means and said bit line at the same time said latched-type sense amplifying means is enabled.

BRIEF DESCRIPTION OF THE DRAWINGS

Other objects and aspects of the invention will become apparent from the following description of the embodiments with reference to the accompanying drawings, in which.

DETAIL DESCRIPTION OF THE PREFERRED EMBODIMENT

Hereinafter, the present invention will be described below referring to FIGS. 2 to 4.

Figure 1:
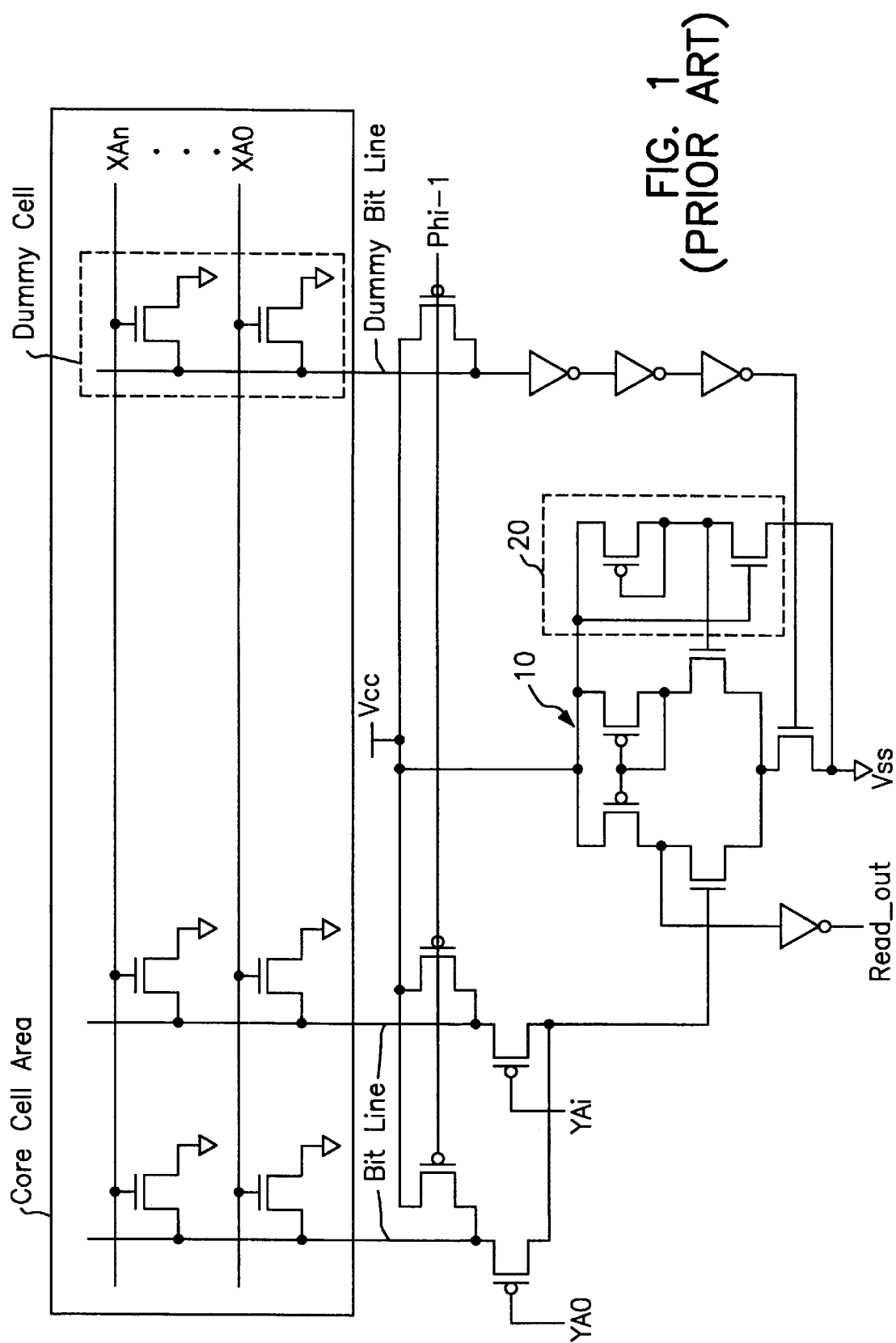
FIG. 1 is a schematic view illustrating a semiconductor memory device (ROM) including a conventional single-ended sense amplifier.
Figure 2:
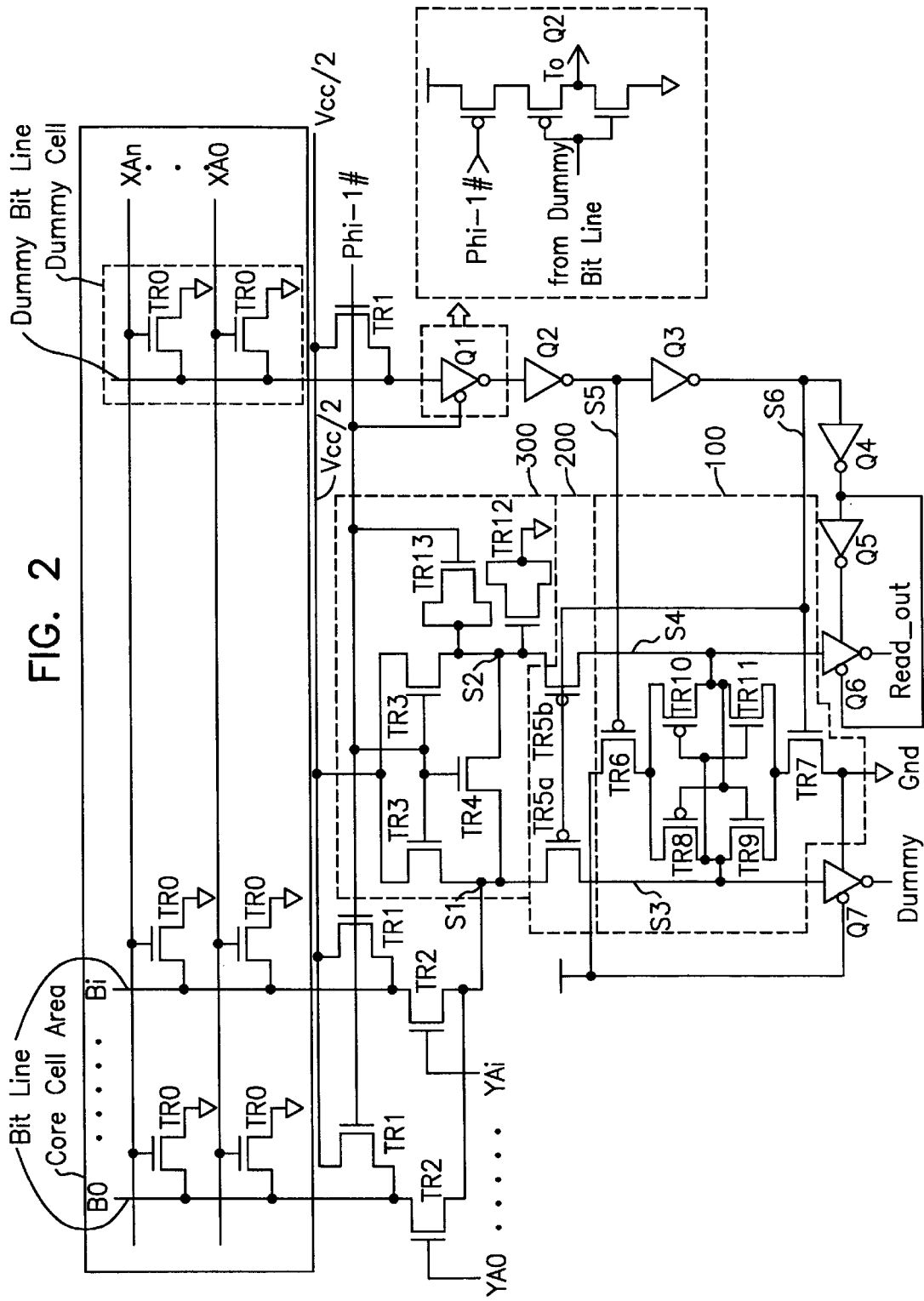
FIG. 2 is a schematic view illustrating a semiconductor memory device (ROM) including a single-ended sense amplifier in accordance with the present invention.

First, referring to FIG. 2, a sense amplifier according to the present invention is shown in FIG. 2. Also, shown in FIG. 2 are a core cell area, single-ended bit lines, a single-ended dummy line, a single-ended sense amplifier 100, a reference voltage generator 300, a switching unit 200. The bit lines B0 to Bi and the dummy bit line are precharged by NMOS transistors TR1 in response to a control signal Phi-1# (inversed signal of Phi-1). Also, the bit lines B0 to Bi are selected by NMOS transistors TR2 of which gates are coupled to column selecting signals YA0 to YAi.

The single-ended sense amplifier 100 according to the present invention is an amplifier of latched type. Accordingly, the memory device according to the present invention includes the single-ended sense amplifier 100 of latched type, which senses the voltage difference between a reference voltage and the bit line voltage during the sensing operation, the reference voltage generator 300 generating the reference voltage for the single-ended sense amplifier 100, and the switching unit 200 separating the single-ended sense amplifier 100 from the output from the bit lines and the reference voltage generator 300.

Sense enable clock signals are applied to the single-ended sense amplifier 100 through a tri-state butter Q1 converting the voltage of ½ Vcc into the voltage of Vcc. The sense enable clock signals are input into the gates of PMOS transistors TR5a and TR5b in the switching unit 200 and then control the PMOS transistors TR5a and TR5b.

In the present invention, column selecting transistors TR2 are made of NMOS transistors for high speed up the memory device. At this time, the bit lines are precharged with the voltage of ½ Vcc to prevent the threshold voltage of the NMOS transistor from being dropped. The voltage conversation of the ½ Vcc voltage level of the dummy bit line to the Vcc voltage level is carried out by the tri-state buffer Q1 in which the pull-up operation is controlled in response to the Phi-1# signal.

The switching unit 200 includes two PMOS transistors TR5a and TR5b and a sense enable signal S6, which is a modeling signal from the dummy bit line through the tri-state buffer Q1 and inverters Q2 and Q3, is applied to the each gate of the two PMOS transistors TR5a and TR5b. The single-ended sense amplifier 100 of latched type includes a CMOS inverter latch circuit (TR8, TR9, TR10 and TR11) to amplify the signal S3 output from the bit line and the signal S4 output from the reference voltage generator 300. The single-ended sense amplifier 100 also includes a PMOS transistor TR6 connecting the CMOS inverter latch circuit to a power supply under the control of the sense enable signal S5 provided by the tri-state buffer Q1 and the inverter Q2. Furthermore, the sense enable signal S6 is input into the gate of an NMOS transistor TR7 to enable the single-ended sense amplifier 100. It should be noted that the signals S5 and S6 are modeling signals from the dummy bit line via the tri-state Q1 and the inverters Q2 and Q3 as shown in FIG. 2.

The reference voltage generator 300 provides two current paths, a first current path of which is provided by the PMOS transistor TR5a and a second current path of which is provided by the PMOS transistor TR5b. In addition, the first current path is connected to the bit lines. The second current path is connected to a common source/drain terminal of a capacitive transistor TR13, which is controlled in response to the Phi-1# signal, and connected to a gate of a capacitive transistor TR12 whose common source/drain terminal gate is coupled to a ground voltage level. The first current path and the second current path are precharged with ½ Vcc by NMOS transistors TR3 having their gates connected to the Phi-1# signal and the reference voltage generator 300 is also equalized by a NMOS transistor TR4 in response to the Phi-1# signal.

The detailed description of the sensing operation of the present invention will be described referring to FIGS. 3 and 4. FIGS. 3 and 4 shows a voltage level of each element in reference to the control signal Phi-1#. As mentioned above, each of the bit lines and the dummy line are precharged with the voltage level of ½ Vcc via the NMOS transistor TR1 controlled by the Phi-1# signal. The bit line is selected by the NMOS transistor TR2 in response to the column address signal YAi. Before the bit lines B0 to Bi are respectivly selected in response to the column address signals YA0 to YAi, the voltage of the output signal (signal S1) from the bit line is maintained at a voltage level of ½ Vcc. However, this bit line voltage may have a little voltage difference according to the stored data or according as there exist the transistor TR0 or not.

When the logic transition of the control signal Phi-1# (inverted signal of the signal Phi-1) is achieved from a high level to a low level, a little voltage of the signal S2 is dropped on the second current path due to the capacitor charge sharing of the capacitive transistors TR13 and TR12 in the reference voltage generator 300. At this time, the amount of dropped voltage may be determined in the ratio of the capacitance of the transistor TR13 to the capacitance of the transistor TR12.

on the other hand, there always exist the transistors TR0 coupled to the dummy line and the high to low transition is achieved. At this time, the tri-state buffer Q1, which is coupled to the voltage of Vcc, operates when the control signal Phi-1# is at low level and then generates the sense enable signals S5 and S6 which are timing-adjusted by the PMOS and NMOS transistors therein. As a result, the control signal Phi-1# serves to convert a low dummy bit line voltage into a high voltage which is capable of being used as an enable signal and another control signal.

Because the transistors TR5a and TR5b are turned off before the sense enable clock signals S5 and S6 are input into the gates of the transistors TR6 and TR7, the bit line signal S1 and the signal S2 of the reference voltage generator 200 are maintained at the same voltage level, and also the signal S3 of the single-ended sense amplifier 100 and the signal S4 of the single-ended sense amplifier 100 are maintained at the same voltage level. The PMOS transistors TR5a and TR5b are turned on, and then the single-ended sense amplifier 100 of the latched type begins sensing the voltage difference with the operation of the driving transistors (NMOS transistors TR6 and TR7). Due to the sensing operation of the single-ended sense amplifier 100, the voltage difference between the signals S3 and S4 are instantaneously increased.

In the preferred embodiment, to remove an undesired power consumption and to speed up its operation, the control signal Phi-1 is disabled by the sense enable clock signal S5. By doing so, word line address signal XAn and column selecting signal YAi are simultaneously nonactivated, and the current path, through which the current flows to the cell transistor TR0 coupled to the bit line, can be blocked, and then the undesired power consumption may be removed. As a result, the core area is at a precharge state at the time the single-ended sense amplifier 100 senses the voltage difference in response to the sense enable signal. This timing control can be controlled by inverters Q4 and Q5 for time delay, and a tri-state buffer Q6 controlling the output of the single-ended sense amplifier 100. In addition, this timing control is carried out by modifying the logic circuit to produce the control signal Phi-1. As described above, by selectively separating the sinqle-ended sense amplifier 100 from the bit line and the reference voltage generator 200 through the PMOS transistors TR5a and TR5b at the same time the sensing operation starts, the swing width of the signals S1 and S2 is minimized, thereby decreasing the power consumption. Further, because the output voltage level of the reference voltage generator 200 can be determined by the ratio of the capacitance of the transistor TR13 to the capacitance of the transistor TR12, the sensing operation may occur with the fine voltage difference.

Figure 3:
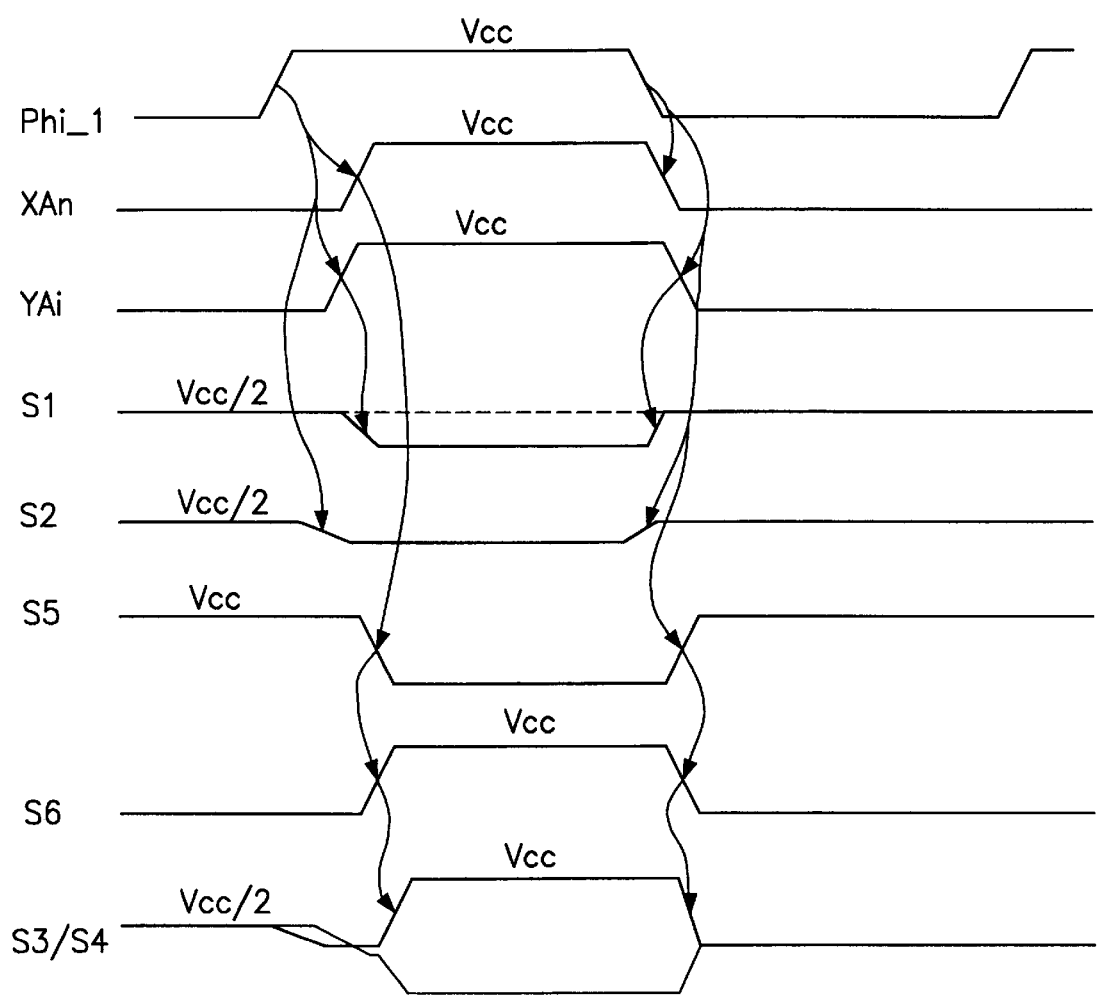
FIGS. 3 and 4 are timing charts illustrating voltage relevant to the single-ended sense amplifier of latched type in accordance with the present invention.
Figure 4:
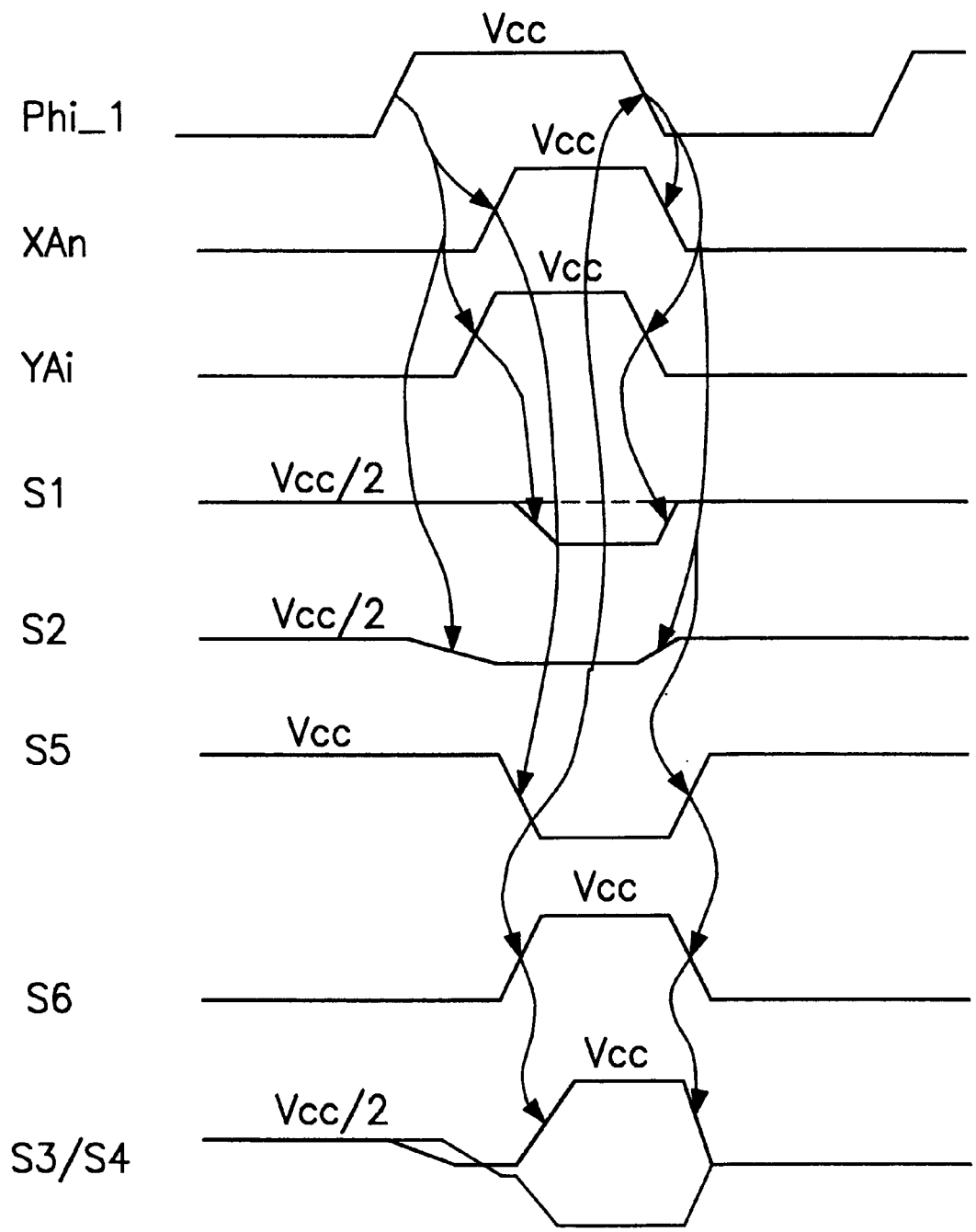

Referring to FIG. 3, with the rise of the control signal Phi-1 rises, the word line signal (from X-decoder) XA and column selecting signal (from Y-decoder) YAi are activated and the bit line signal (signal S1) is determined by the voltage of ½ Vcc after the word line signal XAn is activated. The signal S2 of the reference voltage generator 200 is also determined by the voltage of ½ Vcc when the control signal Phi-1 rises. Further, the sense enable signals S5 and S6 are activated according to the control signal Phi-1 from the dummy bit line. In particular, as described above, because the control signal Phi-1 is nonactivated by the sense enable clock signal S5, the memory device may effectively make arrangements for the reception of the net addresses.

As apparent from the above description, the present invention provides a memory device for a high speed and low power consumption, by simultaneously performing the sensing operation of the voltage difference with the nonactivation of the word line address signal XAn. Accordingly, the present invention has an effect of the correspondence to a high speed and low power microprocessor.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A semiconductor device having a single-ended bit line structure, said semiconductor device comprising:

a plurality of bit lines, each of which is coupled to a plurality of memory cells, wherein said bit lines are precharged in response to a first control signal;

a reference voltage generating means for generating a constant voltage through a capacitor charge sharing means;

a latched-type sense amplifying means for amplifying a voltage difference between an output from said reference voltage generating means and outputs from said bit lines coupled to said memory cells in response to a second control signal;

a switching means for separating said latched-type sense amplifying means from said reference voltage generating means and said bit lines in response to said second control signal; and a control signal generating means for providing said second control signal to said latched-type sense amplifying means and said switching means, wherein said control signal generating means includes:
  a dummy bit line coupled to a plurality of dummy cells; and
  a voltage conversion means for converting a voltage on said dummy bit line into said second control signal, wherein said second control signal is used as an enable signal of said latched-type sense amplifying means and used to electrically couple said latched-type sense amplifying means to said reference voltage generating means and said bit lines.

2. The semiconductor device in accordance with claim 1, wherein said switching means comprises:
  a first transistor connecting said bit lines to said latched-type sense amplifying means, wherein said first transistor is controlled by said second control signal which is produced in response to said first control signal from said dummy bit line; and
  a second transistor connecting said reference voltage generating means to said latched-type sense amplifying means, wherein said second transistor is controlled by said second control signal.

3. The semiconductor device in accordance with claim 2, wherein said latched-type sense amplifying means comprises:
  a cross-coupled amplifier for amplifying said voltage difference; and
  a third transistor connecting a power supply to said cross-coupled amplifier in response to a third control signal, wherein said second control signal is a delayed inverted signal of said third control signal; and
  a fourth transistor connecting said cross-coupled amplifier to a ground voltage level in response to said second control signal.

4. The semiconductor device in accordance with claim 3, wherein said reference voltage generating means comprises;
  a first current path provided between said bit lines and said first transistor;
  a second current path provided between said capacitor charge sharing means and said second transistor;
  fifth and sixth transistors for precharging said first and second current paths in response to said first control signal, respectively;
  a seventh transistor for equalizing said first current path with said second current path in response to said first control signal;
  a first capacitive transistor having a common source/drain terminal coupled to said second current path and a gate coupled to said first control signal; and
  a second capacitive transistor having a common source/drain terminal coupled to said ground voltage level and a gate coupled to said second current path.

5. The semiconductor device in accordance with claim 3, wherein said semiconductor device further comprises a tri-state buffer coupled to said dummy bit line for generating said second and third control signals from said dummy bit line in response to said first control signal.

6. The semiconductor device in accordance with claim 4, wherein an amount of dropped voltage on said second current path is determined by the ratio of the capacitance of said first capacitive transistor to the capacitance of said second capacitive transistor.

* * * * *